US005825310A

United States Patent [19]

Tsutsui

[11] Patent Number: 5,825,310

[45] Date of Patent: Oct. 20, 1998

[54] SIGNAL ENCODING METHOD

[75] Inventor: Kyoya Tsutsui, Kanagawa, Japan

[73] Assignee: Sony Corporation, Tokyo, Japan

[21] Appl. No.: 788,897

[22] Filed: Jan. 22, 1997

[30] Foreign Application Priority Data

Jan. 30, 1996 [JP] Japan .................................... 8-014517

[51] Int. Cl.[6] ........................................ H03M 7/00

[52] U.S. Cl. ........................................ 341/51; 364/724.01

[58] Field of Search .................... 341/157, 70; 395/2.38, 395/2.39

[56] References Cited

U.S. PATENT DOCUMENTS

| | | | |
|---|---|---|---|
| 4,535,472 | 8/1985 | Tomcik | 381/31 |
| 4,912,763 | 3/1990 | Galand et al. | 381/31 |
| 5,235,671 | 8/1993 | Mazor | 395/2 |
| 5,375,189 | 12/1994 | Tsutsui | 395/2.38 |
| 5,438,643 | 8/1995 | Akagiri et al. | 395/2.1 |
| 5,632,003 | 5/1997 | Davidson et al. | 395/2.38 |
| 5,634,082 | 5/1997 | Shimoyoshi et al. | 395/2.38 |
| 5,640,421 | 6/1997 | Sonohara et al. | 375/240 |

FOREIGN PATENT DOCUMENTS

| | | | |
|---|---|---|---|
| 0506394 A2 | 9/1992 | European Pat. Off. | G10L 7/00 |
| 0525809 A2 | 2/1993 | European Pat. Off. | H04B 1/66 |
| WO 90/09022 | 8/1990 | WIPO | G11B 20/10 |
| WO 93/09645 | 5/1993 | WIPO | H04S 1/00 |

OTHER PUBLICATIONS

J.H. Rothweiler, "Polyphase Quadrature Filters —A New Subband Coding Technique," ICASSP 83 Proceedings, IEEE International Conference on Acoustics, Speech & Signal Processing, Apr. 1983, vol. 3 of 2, pp. 1280–1283.

R.E. Crochiere et al., "Digital Coding of Speech in Sub–Bands," American Telephone and Telegraph Company, The Bell System Technical Journal, vol. 55, No. 8, Oct. 1976, pp. 1069–1085.

J.P. Princen et al., "Subband/Transform Coding Using Filter Bank Designs Based on Time Domain Aliasing Cancellation," IEEE, 1987, pp. 2161–2164.

R. Zelinski et al., "Adaptive Transform Coding of Speech Signals," IEEE Transactions on Acoustics, Speech and Signal Processing, vol. ASSP–25, No. 4, Aug. 1977, pp. 299–309.

M.A. Krasner, "The Critical Band—Coder—Digital Encoding of Speech Signals Based on the Perceptual Requirements of the Auditory System," IEEE Journal, vol. 1–3, 1980, pp. 327–331.

*Primary Examiner*—Brian K. Young
*Attorney, Agent, or Firm*—Limbach & Limbach L.L.P.

[57] ABSTRACT

A signal encoding method for real-time encoding an acoustic signal using a small hardware. The spectral signal components of an input signal are split into encoding units as the units for encoding. At step ST102, an estimated value of the required number of bits is computed from one encoding unit to another. The total number of bits required in encoding the spectral signal components of the input signal is adjusted in steps ST103 and in the following steps based on the estimated value of the number of bits computed from one encoding unit to another.

9 Claims, 18 Drawing Sheets

| m | CODES |
|---|---|
| -1 | 11 |
| 0 | 0 |
| 1 | 10 |

FIG.7A

| m | CODES |
|---|---|
| -3 | 1111 |
| -2 | 1101 |
| -1 | 101 |
| 0 | 0 |
| 1 | 100 |
| 2 | 1100 |
| 3 | 1110 |

FIG.7B

| SPECTRUM | (a) | (b) |
|---|---|---|
| s1 | 0 | 0 |
| s2 | +1 | +1 |
| s3 | -1 | 0 |
| s4 | -1 | -1 |
| s5 | +1 | +1 |
| s6 | 0 | 0 |
| s7 | -1 | -1 |
| s8 | +1 | 0 |

FIG.11

SIGNAL ENCODING METHOD

BACKGROUND OF THE INVENTION

1. Field of the Invention

This invention relates to a signal encoding method for encoding input digital data by so-called high-efficiency encoding.

2. Description of the Related Art

A variety of high-efficiency encoding techniques exist for encoding audio or speech signals. Examples of these techniques include so-called transform coding as a blocking frequency splitting system of the blocking frequency spectrum splitting system (orthogonal transform) and a so-called sub-band coding system (SBC) as a non-blocking frequency spectrum splitting system. In the transform coding, audio signals on the time axis are blocked every pre-set time interval, the blocked time-domain signals are transformed into signals on the frequency axis, and the resulting frequency-domain signals are split into plural frequency bands and encoded from band to band. In the sub-band coding system, the audio signals on the time axis are split into plural frequency bands and encoded without blocking. In a combination of the sub-band coding system and the transform coding system, the audio signals on the time axis are split into plural frequency bands by sub-band coding system, and the resulting band-based signals are transformed into frequency-domain signals by orthogonal transform for encoding.

As band-splitting filters used in the sub-band coding system, there is a so-called quadrature mirror filter (QMF) discussed in R. E. Crochiere, "Digital Coding of Speech in Subbands", Bell Syst. Tech. J., Vol.55, No.8, 1976. This QMF filter divides the frequency spectrum in two bands of equal bandwidths. With the QMF filter, so-called aliasing is not produced on subsequent synthesis of the band-split signals.

The technique of splitting the frequency spectrum is discussed in Joseph H. Rothweiler, "Polyphase Quadrature Filters - A New Subband Coding Technique", ICASSP 83 BOSTON. With the polyphase quadrature filter, the signal can be split at a time into plural frequency bands of equal bandwidths.

Among the techniques for orthogonal transform, there is known such a technique in which the input audio signal is split into frames of a predetermined time duration and the resulting frames are processed by discrete Fourier transform (DFT), discrete cosine transform (DCT) or modified DCT (MDCT) to convert the signals from the time axis to the frequency axis. Discussions of a MDCT may be found in J. P. Princen and A. B. Bradley, "Subband/Transform Coding Using Filter Bank Based on Time Domain Aliasing Cancellation", ICASSP 1987.

If DFT or DCT is used as method for orthogonal transform of the waveform signal, and transform is performed with time blocks each consisting of, for example, M sample data, M independent real-number data are obtained. Since M1 sample data are overlapped between neighboring time blocks for reducing connection distortion of time blocks, M real-number data are obtained on an average for (M-M1) sample data with DFT or DCT, so that these M real-number data are subsequently quantized and encoded.

If the above-described MDCT is used as the orthogonal transform method, M independent real-number data are obtained from 2M samples resulting from overlapping N sample data with both neighboring time blocks. That is, if MDCT is used, M real-number data are obtained from M sample data on an average. These M real-number data are subsequently quantized and encoded. In the decoding apparatus, waveform elements obtained on inverse transform in each block from the codes obtained using MDCT are summed together with interference for reconstructing waveform signals.

In general, if the time block for orthogonal transform is lengthened, frequency resolution is increased, such that the signal energy is concentrated in specified spectral signal components. Therefore, by employing MDCT in which a long time block length obtained by overlapping one-half sample data between neighboring time blocks is used for orthogonal transform and in which the number of resulting spectral signal components is not increased as compared to the number of the original time-domain sample data, a higher encoding efficiency may be realized than if the DFT or DCT is used. If a sufficiently long overlap between neighboring time blocks is used, connection distortion between time blocks of waveform signals can be reduced.

By quantizing signal components split from band to band by a filter or orthogonal transform, it becomes possible to control the band subjected to quantization noise, thus enabling encoding with perceptually higher encoding efficiency by exploiting masking effects. By normalizing respective sample data with the maximum value of the absolute values of the signal components in each band prior to quantization, the encoding efficiency can be improved further.

As the band splitting width used for quantizing the signal components resulting from splitting of the frequency spectrum of the audio signals, the band width taking into account the psychoacoustic characteristics of the human being is preferably used. That is, it is preferred to divide the frequency spectrum of the audio signals into a plurality of, for example, 25, critical bands. The width of the critical bands increases with increasing frequency. In encoding the band-based data in such case, bits are fixedly or adaptively allocated among the various critical bands. For example, when applying adaptive bit allocation to the special coefficient data resulting from a MDCT, the spectra coefficient data generated by the MDCT within each of the critical bands is quantized using an adaptively allocated number of bits. The following two techniques are known as the bit allocation technique.

In R. Zelinsky and P. Noll, "Adaptive transform Coding of Speech Signals", "IEEE Transactions of Acoustics, Speech and Signal processing", vol. ASSP-25, August 1977, bit allocation is carried out on the basis of the amplitude of the signal in each critical band. This technique produces a flat quantization spectrum and minimizes noise energy, but the noise level perceived by the listener is not optimum because the technique does not exploit the psychoacoustic masking effect.

In M. A. Krassener, "The Critical Band Coder- Digital Encoding of the Perceptual Requirements of the Auditory System", there is described a technique in which the psychoacoustic masking effect is used to determine a fixed bit allocation that produces the necessary bit allocation for each critical band. However, with this technique, since the bit allocation is fixed, non-optimum results are obtained even for a strongly tonal signal such as a sine wave.

For overcoming this problem, it has been proposed to divide the bits that may be used for bit allocation into a fixed pattern allocation fixed for each small block and a bit allocation portion dependent on the amplitude of the signal in each block. The division ratio is set depending on a signal related to the input signal such that the division ratio for the fixed allocation pattern portion becomes higher the smoother the pattern of the signal spectrum.

With this method, if the audio signal has high energy concentration in a specified spectral signal component, as in the case of a sine wave, abundant bits are allocated to a block containing the signal spectral component for significantly improving the signal-to-noise ratio as a whole. In general, the hearing sense of the human being is highly sensitive to a signal having sharp spectral signal components, so that, if the signal-to-noise ratio is improved by using this method, not only the numerical values as measured can be improved, but also the audio signal as heard may be improved in quality.

Various other bit allocation methods have been proposed and the perceptual models have become refined, such that, if the encoder is of high ability, a perceptually higher encoding efficiency may be realized.

In these methods, it has been customary to find a real-number reference value of bit allocation whereby the signal to noise ratio as found by calculations will be realized as faithfully as possible and to use an integer approximate to this reference value as the allocated number of bits.

In the U.S. application Ser. No. 08/374,518 as filed by the present Assignee, there is disclosed an encoding method in which a perceptually critical tonal component, that is a spectral signal component exhibiting signal energy concentration in the vicinity of a specified frequency, is separated from the spectral signal components, and encoded in separation from other spectral components. This method enables audio signals to be encoded efficiently with high efficiency without substantially producing perceptual deterioration of audio signals.

In constructing an actual codestring, it suffices to encode the quantization precision information and the normalization coefficient information with a predetermined number of bits for each band designed for normalization and quantization and to encode the normalized and quantized spectral signal components.

In MPEG-1 audio, there is disclosed a high-efficiency encoding system in which the number of bits representing the quantization precision information will be different values from band to band. Specifically, the number of bits representing the quantization precision information is set so as to be smaller with increasing frequency.

There is also known a method in which the quantization precision information is determined from, for example, the normalization coefficient information by a decoder without directly encoding the quantization precision information. Since the relation between the normalization coefficient information and the quantization precision information is set at the time of standard formulation, it becomes impossible to introduce quantization precision control based on an advanced perceptual model in future. In addition, if there is allowance in the compression ratio to be realized, it becomes necessary to set the relation between the normalization coefficient information and the quantization precision information from one compression ratio to another.

In D. A. Huffman, "A Method for Construction of Minimum Redundancy Codes", Proc. I.R.E., 40, p.1098 (1952), quantized spectral signal components are encoded more efficiently by encoding using variable length codes.

In the U.S. application Ser. No. 08/491,948, filed by the present Assignee, it is proposed to adjust the normalization coefficients in case of using the variable length codes for more efficient encoding of the quantized spectral signal components with a smaller number of bits. With this method, there is no risk of significant signal dropout in a specified area in case of raising the compression ratio. In particular, there is no risk of dropout or appearance of specified band signal components on the frame basis, thus avoiding the problem of generation of perceptually objectionable harsh noise.

However, if the conventional method is used for encoding with the aid of the above-described various encoding techniques, the number of processing steps is increased, such that it becomes difficult to encode the acoustic signals by a small hardware on the real-time basis.

SUMMARY OF THE INVENTION

It is therefore an object of the present invention to provide a signal encoding method whereby the acoustic signals can be encoded by a small hardware on the real-time basis.

According to the present invention, there is provided a signal encoding method for quantizing and encoding signal components resulting from resolution of an input signal into plural frequency components, including the steps of splitting the signal components of the input signal into plural band units as encoding units, computing an estimated value of the required number of bits as calculated from one band unit to another and adjusting the total number of bits required in encoding the signal components of the input signal based on the estimated value of the required number of bits as computed from one band unit to another.

With the signal encoding method of the present invention, bit allocation is adjusted based on the estimated value of the number of bits used for reducing the processing volume required for encoding.

Also, with the signal encoding method of the present invention, a variety of encoding methods for increasing the compression ratio can be carried out efficiently with sufficient signal quality for real-time encoding of the acoustic signal with a small-sized hardware.

BRIEF DESCRIPTION OF THE DRAWINGS

FIG. 7(A) shows a table for illustrating a typical encoding method.

FIG. 7(B) shows a table for illustrating a typical encoding method.

FIG. 11 shows a table for illustrating the number of bits used for normalizing and quantizing the spectral signal components.

DESCRIPTION OF THE PREFERRED EMBODIMENTS

Figure 1:
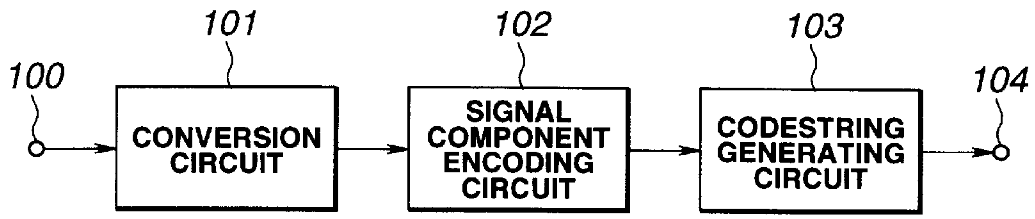
FIG. 1 is a block circuit diagram showing an illustrative structure of an encoder for carrying out the signal encoding method according to the present invention.

Referring to the drawings, preferred embodiments of the present invention will be explained in detail.

FIG. 1 shows, in a block diagram, an illustrative structure of an encoder (encoding apparatus) for encoding acoustic waveform signals according to the present invention.

In the structure of FIG. 1, an acoustic waveform signal entering an input terminal 100 is transformed by a transform circuit 101 into frequency signal components (spectral signal components) which are sent to a signal component encoding circuit 102 for encoding. The resulting encoded signals are sent to a codestring generating circuit 103 so as to be formed into a codestring which is outputted at an output terminal 104. The codestring outputted at the output terminal 104 is modulated by a pre-set method, after appendage of error correction codes thereto, so as to be then recorded on a recording medium, such as magnetic tape, or transmitted over a transmission medium, such as communication cable or electrical waves.

Figure 2:
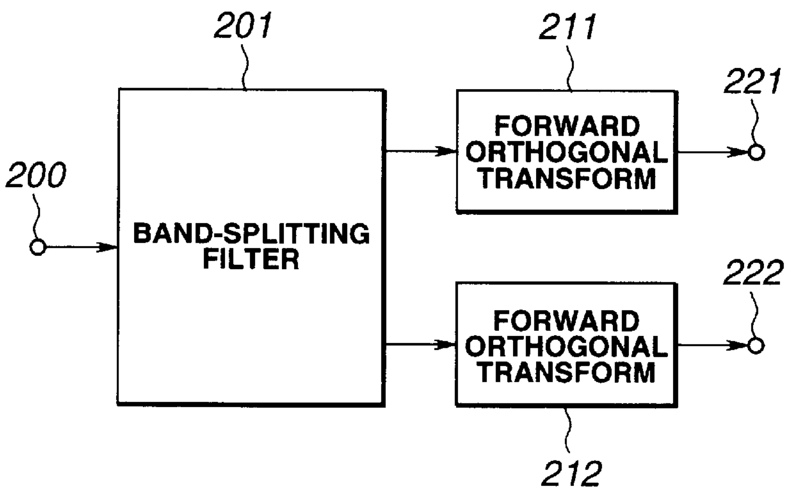
FIG. 2 is a block circuit diagram showing an illustrative structure of a conversion circuit of the encoder according to the present invention.

FIG. 2 shows an illustrative structure of the transform circuit 101 of FIG. 1. A signal entering a terminal 200 is split by a band-splitting filter 201 into two bands. The resulting band-split signals are transformed into spectral signal components by forward orthogonal transform circuits 211, 212 performing orthogonal transform, such as MDCT. The input terminal 200 of FIG. 2 corresponds to the input terminal 100 of FIG. 1. The spectral signal components, outputted by the terminals 221, 222 of FIG. 2, are sent to the signal component encoding circuit 102 of FIG. 1. In the configuration of FIG. 2, the bandwidths of two signals outputted by the band-splitting filter 201 are one-half the bandwidth of the input signal at terminal 200, such that the signal outputted by the band-splitting filter 201 is decimated to one-half the input signal at terminal 200. Of course, the transform circuit 101 may be configured otherwise in addition to the configuration shown in FIG. 2. For example, the input signal may be directly transformed by MDCT into spectral signal components without splitting into bands. Alternatively, the input signal may be transformed by DFT or DCT instead of by MDCT. Although the signal may be split into finer band components by a band-splitting filter, the above orthogonal transform is preferably used in the present invention since then a large number of frequency components may be obtained by a smaller processing volume.

Figure 3:
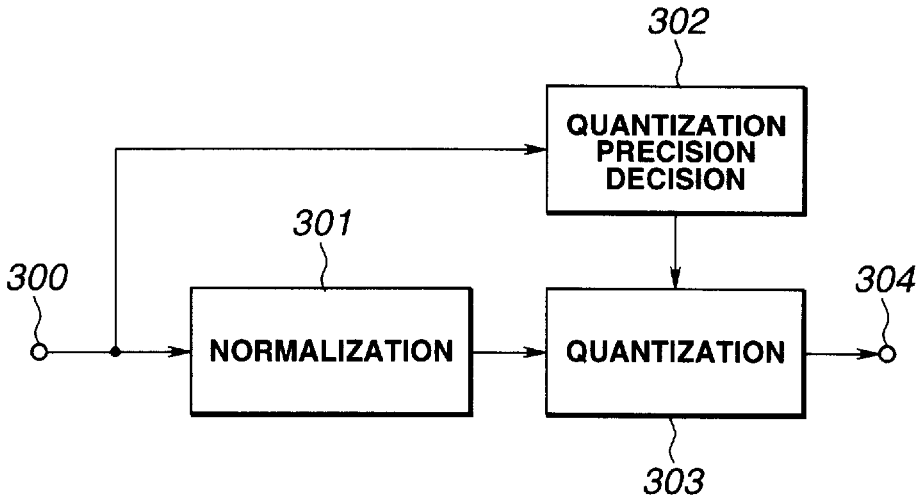
FIG. 3 is a block circuit diagram showing an illustrative structure of a signal component encoding circuit of the encoder according to the present invention.

FIG. 3 shows an illustrative structure of the signal component encoding circuit 102. The spectral signal components supplied to a terminal 300 are normalized by a normalizing circuit 301 from one pre-set band to another and sent to a quantization precision decision circuit 303. The quantization precision decision circuit 303 quantizes the normalized values based on the quantization precision as computed from the spectral signal components. The spectral signal components, sent to the terminal 300 of FIG. 3, correspond to the output signal of the transform circuit 101 of FIG. 1, and becomes an input signal to the codestring generating circuit 103 of FIG. 1 outputted from a terminal 304 of FIG. 3. The output signal of terminal 304 of FIG. 3 contains the normalization coefficient information and quantization precision information, in addition to the quantized signal components (quantized values). Thus the normalization coefficient information and quantization precision information are processed, along with the codestring, so as to be recorded on the recording medium or transmitted over the transmission medium.

Figure 4:
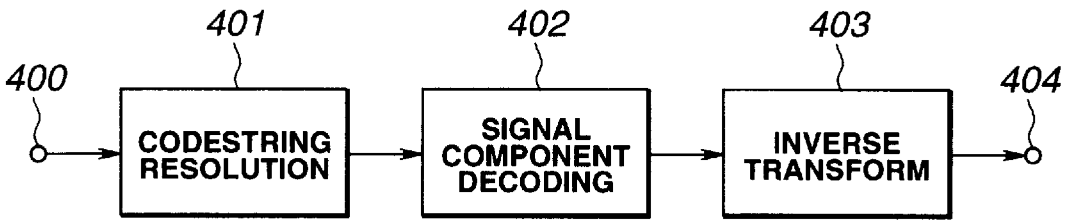
FIG. 4 is a block circuit diagram showing an illustrative structure of a decoder for carrying out decoding as a counterpart of encoding by the encoding method of the present invention.

FIG. 4 shows, in a block diagram, an illustrative structure of a decoder (decoding apparatus) for decoding acoustic signals from the codestring generated by the encoder of FIG. 1 and for outputting the decoded signal.

Referring to FIG. 4, the codestring recorded on the recording medium, reproduced, demodulated and corrected for errors, or the codestring transmitted over the transmission medium, demodulated and corrected for errors, is supplied to an input terminal 400. The codestring supplied to the input terminal 400 is sent to a codestring resolution circuit 401 in which the codes of the respective spectral signal components are extracted from the codestring and separated from the codes of the quantization precision information and the normalization coefficient information. These codes are sent to a signal component decoding circuit 402 which then decodes the respective spectral signal components using the quantization precision information and the normalization coefficient information. The decoded respective spectral signal components are processed by an inverse transform circuit 403 with an inverse transform which is the reverse of the orthogonal transform described above, so as to be thereby transformed into acoustic waveform signals which are outputted at an output terminal 404.

Figure 5:
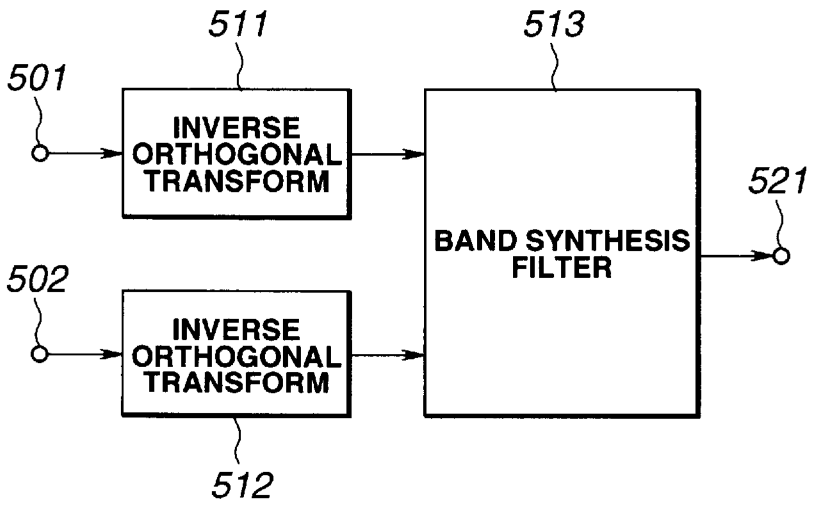
FIG. 5 is a block circuit diagram showing an illustrative structure of a back-conversion circuit of the decoder according to the present invention.

FIG. 5 shows an illustrative structure of the inverse transform circuit 403 of FIG. 4. This inverse transform circuit is a counterpart circuit of the transform circuit of FIG. 2, that is, the spectral signal components of the respective bands, supplied to terminals 501, 502, are transformed by inverse orthogonal transform circuits 511, 512 associated with the respective frequency bands, and the signals of the respective bands are synthesized by a band synthesis filter 513. Meanwhile, the signal components of the respective bands, supplied to the terminals 501, 502, are outputs of the signal component decoding circuit 402, while an output of a terminal 521 is outputted at output terminal 404 of FIG. 4.

A typical signal encoding method in the above-described encoder of FIG. 1 is now explained.

Figure 6:
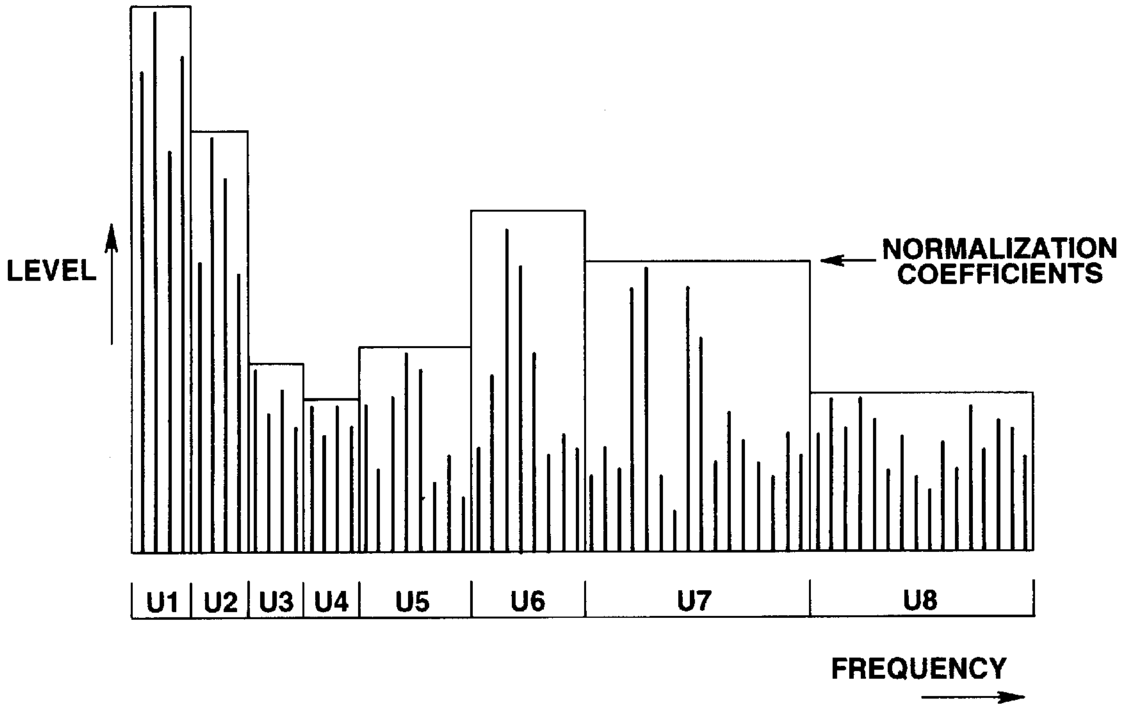
FIG. 6 illustrates an encoding unit.

FIG. 6 shows an example of spectral signal components obtained by MDCT processing by the transform circuit of FIG. 2. In this figure, the level of the absolute values of the spectral signal components obtained by MDCT is shown converted in dB.

Referring to FIG. 6, the waveform signal has been transformed into 64 spectral signal components every pre-set time block. These spectral component signals are grouped in terms of eight pre-set bands U1 to U8 as units for normalization and quantization. These eight pre-set bands are termed encoding units. That is, these encoding units serve as units for encoding. The bandwidths of the encoding units are selected to be narrower and broader in the low and high frequency ranges, respectively, for taking the psychoacoustic characteristics of the human being into account for controlling the generation of the quantization noise in a manner matched to the characteristics of the human hearing system. The quantization precision can be varied from one encoding unit to another depending on the manner of distribution of the frequency components for suppressing deterioration in the sound quality to the smallest value possible for achieving psychoacoustically efficient encoding.

For reducing the quantization error in the encoding units, the normalization coefficients in the encoding units are desirably set for approximating the maximum absolute value of the spectral signal components in the encoding units. For $0 \leqq D \leqq 63$, for example, the normalization coefficient is set as shown in the equation (1):

$$F = 2^{\frac{D-12}{3}} \qquad (1)$$

so as to be designated by 6-bit codes representing D. Also, for $0 \leqq B \leqq 15$, it may be designated as shown by the equation (2):

$$M = 2^B - 1 \qquad (2)$$

while a normalized quantized value m for a signal value (spectral signal component) v can assume an integer shown by the equation(3):

$$m(v, F, M) = \frac{v \times M}{F} \qquad (3)$$

The quantization precision can be designated by a 4-bit code representing B.

If the normalized quantized value m is represented by a variable length code, the encoding efficiency can be increased. In general, in a spectral distribution of audio signals, the signal energy is concentrated in many cases in specified frequency components. In such cases, the quantized values obtained on normalizing and quantizing the respective spectral signal components are mostly distributed in a range close to zero. Therefore, the encoding efficiency may be improved by setting shorter codelengths for quantized values close to zero. FIGS. 7(A), 7(B) illustrate examples of giving codes in setting the codelengths for B=1 and for B=2, respectively. If a signal is a tonal signal in which the signal energy is concentrated in specified frequency components, the quantization precision needs to be increased for such signal. The encoding efficiency is preferably increased for such signal for not degrading the sound quality.

Figure 8:
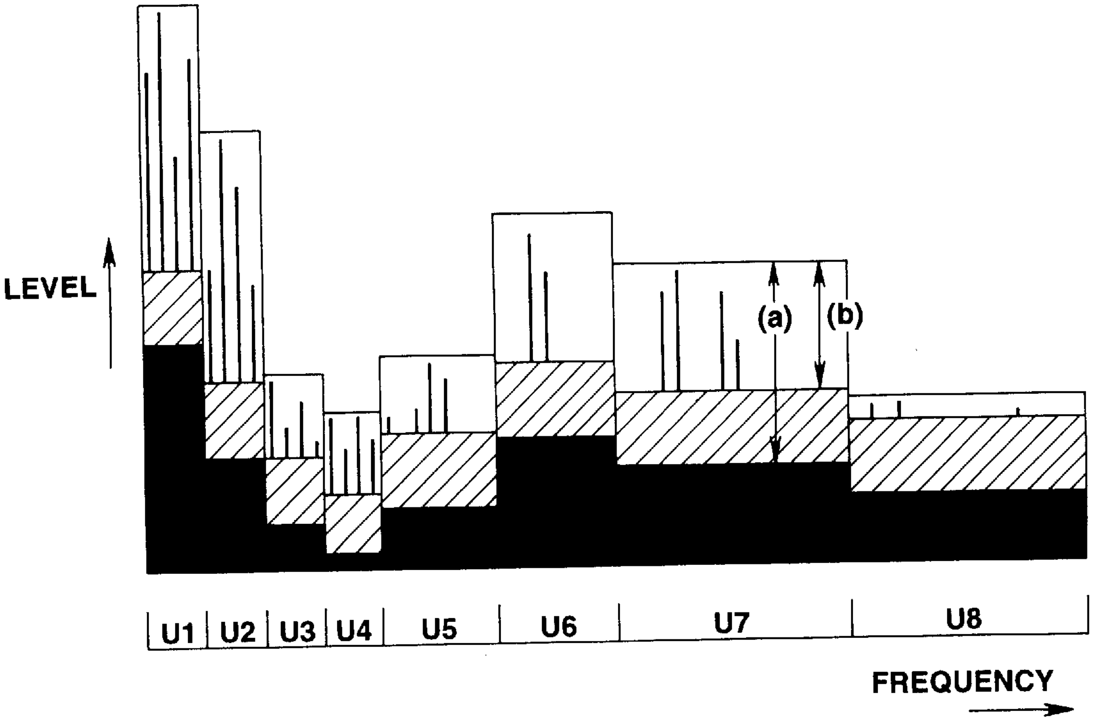
FIG. 8 illustrates typical setting for the initial value of quantization precision.

However, which quantization precision should be used in which encoding unit also differs with the signal compression ratio. FIG. 8 illustrates an example of a method for setting the quantization precision. In this figure, an area in black denotes an ideal allowable noise level as found by minimum audible level or masking calculations. Thus, in the encoding unit U7, for example, bit allocation which realizes the SN ratio shown at (a) leads to realization of the ideal sound quality. However, in fact, the number of bits which is more than is usable is required in many cases for realization of this SN ratio. Therefore, bit allocation obtained by uniformly increasing the number of bits from the ideal allowable noise level, that is the bit allocation which will give the noise level shown shaded for the encoding unit U7, is actually performed for realization of the S/N ratio shown at (b) for the encoding unit U7.

Figure 9:
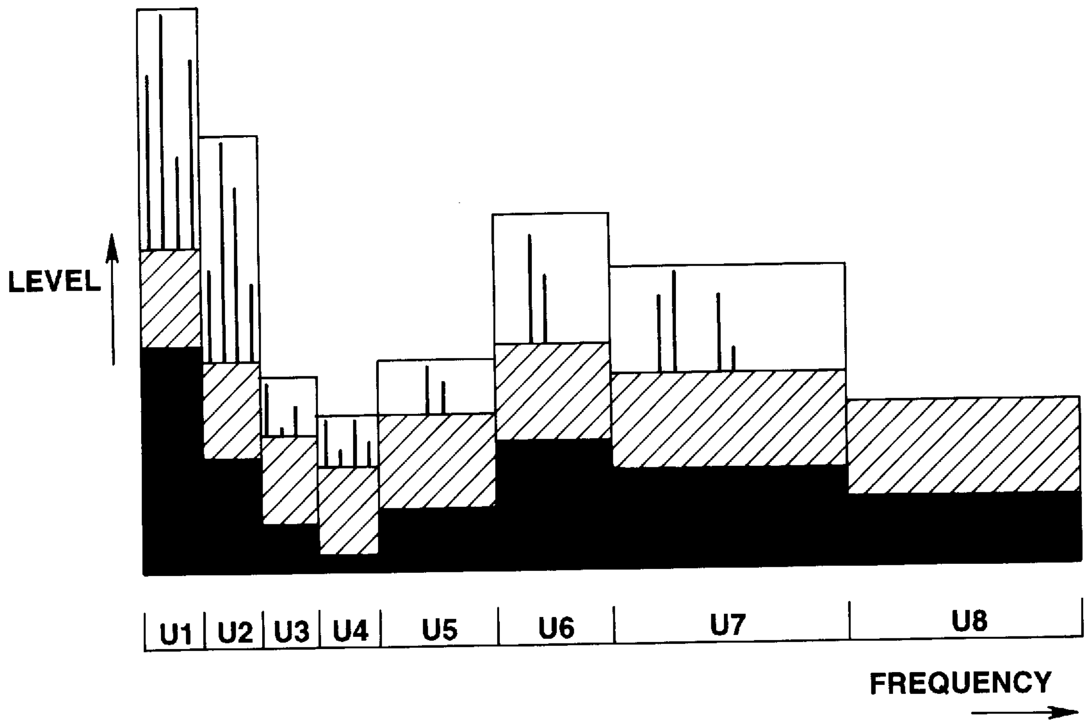
FIG. 9 illustrates bit allocation in case the compression ratio is raised further in setting the initial value of quantization precision.

FIG. 9 shows the manner of bit allocation for the case in which the compression ratio is increased further in the manner as shown in FIG. 8. In this case, no bits are allocated to the encoding unit U8. Such signal dropout for a specified band leads to significant problem in connection with the sound quality. In particular, if signal components in a specified band appears or vanishes depending on frames, the resulting sound becomes extremely harsh to the ear. Although it is possible to lower the quantization precision of other encoding units to allocate more bits to the encoding units in need of bits, depending on the state of bit allocation, it is difficult to cut the number of quantization steps significantly in case of a high compression ratio since then there is no sufficient allowance of quantization precision in the other encoding units.

For overcoming this problem, there is proposed a method for minimizing the problem in connection with the human hearing system while minimizing the reduction of the number of quantization steps in performing the encoding using the variable length codes, as disclosed in the above-mentioned U.S. application Ser. No. 08/491,948.

Figure 10:
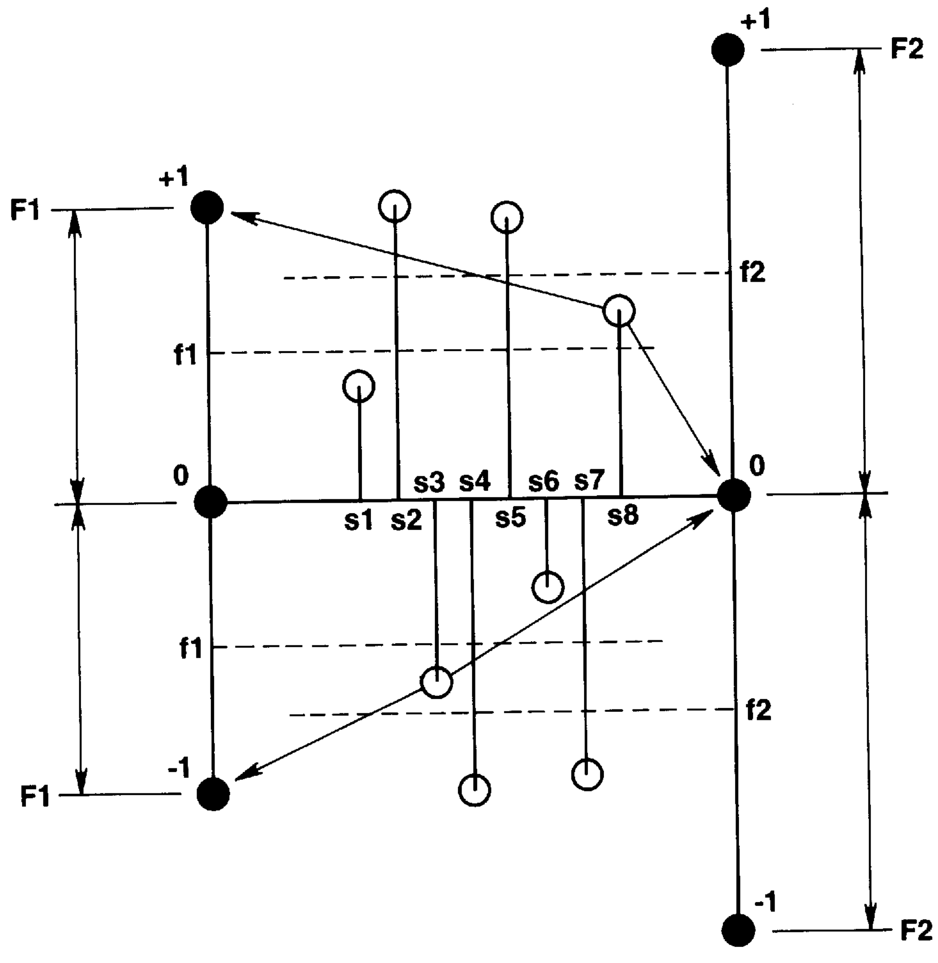
FIG. 10 illustrates how spectral signal components are normalized and quantized.

FIG. 10 illustrates an example of employing the method shown in the aforementioned U.S. application Ser. No. 08/491,948. In this figure, there is shown the manner of normalizing and quantizing spectral signal components s1 to s8. The column (a) in FIG. 11 shows the results obtained by normalizing the spectral signal components using the normalization coefficients having a value F1 shown towards left in FIG. 10 and by quantizing the normalized spectral signal components in three stages. The column (b) in FIG. 11 show the results obtained by normalizing the spectral signal components using the normalization coefficients having a value F2 shown towards right in FIG. 10 and by quantizing the normalized spectral signal components in three stages. That is, if the spectral signal components are normalized using the normalization coefficients having the value F1, the spectral signal components having the absolute values not larger than f1 in FIG. 10 are normalized to a value 0, while those having the absolute values larger than f1 are normalized to a value F1. On the other hand, if the spectral signal components are normalized using the normalization coefficients having the value F2, the spectral signal components having the absolute values not larger than f2 in FIG. 10 are normalized to a value 0, while those having the absolute values larger than f1 are normalized to a value F2. Therefore, if the spectral signal components are normalized using the normalization coefficients having the value F1, the spectral signal components s1, s2, s3, s4, s5, s6, s7 and s8 are normalized to 0, +1, −1, −1, +1, 0, −1 and +1, respectively, as shown at (a) in FIG. 11. On the other hand, if the spectral signal components are normalized using the normalization coefficients having the value F2, the spectral signal components s1, s2, s3, s4, s5, s6, s7 and s8 are normalized to 0, +1, 0, −1, +1, 0, −1 and 0, respectively, as shown at (b) in FIG. 11.

If encoding is done as shown in column (a) in FIG. 11, the signal components having the quantized values +1, 0 and −1 are decoded by the decoder to F1, 0 and −F1, respectively. On the other hand, if encoding is done as shown in column (b) in FIG. 11, the signal components having the quantized values +1, 0 and −1 are decoded by the decoder to F2, 0 and −F2, respectively. The difference between the original signal components and the encoded and decoded spectral signal components is smaller if the signal components are normalized and quantized as shown in column (a) in than in column (b) in FIG. 11. However, if the normalized and quantized values are encoded by the encoding method shown in FIG. 7(A), the ratio of the small-length codes becomes larger if the signal components are normalized and quantized as shown in column (b) than if the signal components are normalized and quantized as shown in column (a) in FIG. 11.

Thus, if the compression ratio becomes extremely high such that the number of usable bits is decreased, reduction in the number of bits may be realized in the above-described signal encoding method by normalizing the signal components using the normalization coefficient having the value of F2 and subsequently encoding the normalized components as shown in column (b) in FIG. 11 rather than by normalizing the signal components using the normalization coefficients having the value of F1 and subsequently encoding the normalized components as shown in column (a) in FIG. 11. The result is that there is no risk of disappearance of the signal components of a special frequency band.

The above-described bit allocation processing can be resolved in two stages. The first stage is the step of setting the initial value of quantization precision for setting which quantization precision is to be provided for each encoding unit, while the second stage is the step of adjusting the quantization precision for adjusting the bit allocation so as to observe the limitation on the total number of usable bits.

The first and second stages will be explained n this order.

The conventional method for setting the initial value of quantization precision has been to compute the masking quantity based on the signal energy and the normalization coefficient related therewith for each encoding unit as set for approximating the critical band and to set the initial value of quantization precision for each encoding unit based on the relation between the resulting minimum audibility level and the normalization coefficient. However, since this method does not take into account the manner of distribution of signal components in the encoding units, the properties of signals in the encoding units, in particular, the psychoacoustically critical properties of the signals in the encoding units as to whether these signals are tonal signals exhibiting sharply changing spectral distribution or noisy signals exhibiting flat spectral distribution, are not properly reflected in setting the quantization precision. In particular, if the compression ratio is high, sufficient signal quality cannot be maintained.

For enabling more precise masking calculations, there is also known a method of finely extracting tonal signal components from the spectral signal components, separately finding the masking quantity by the tonal signal components and that by the other signal components based on the respective masking characteristics and synthesizing the masking quantities to find the minimum audibility level for setting the initial value of the quantization precision from the relation between the resulting minimum audibility level and the normalization coefficients. This method, however, has a drawback that the processing becomes complex and hence the hardware for encoding becomes bulky in size.

Therefore, in the first stage bit allocation, the initial value of the quantization precision is adapted to be set for reflecting the manner of distribution of the signal components in the encoding units by a simplified operation. Specifically, the initial value of the quantization precision is set in accordance with the index as found from a quantity determined on the basis of a unit set fixedly with a bandwidth narrower than the above-described encoding unit (termed herein a component unit). The term fixed herein means that the unit is set fixedly insofar as the signal portion having constant properties is concerned. Thus, if the manner of setting of the component unit differs between a transient signal portion (that is, tonal signal components) and the other stationary signal portion (that is, noisy signal portion), such setting manner is comprised within the scope of the present invention. On the other hand, the bandwidth of the component unit is set within the critical bandwidth which takes the psychoacoustic characteristics of the human being into account and is selected to be narrower towards the lower frequency range. Therefore, if the bandwidth of the component unit is strictly not narrower than the bandwidth of the encoding unit, such case is comprised within the scope of the present invention. The method of extracting and separating the tonal signal components based on the component unit as a unit will be explained subsequently.

Figure 12:
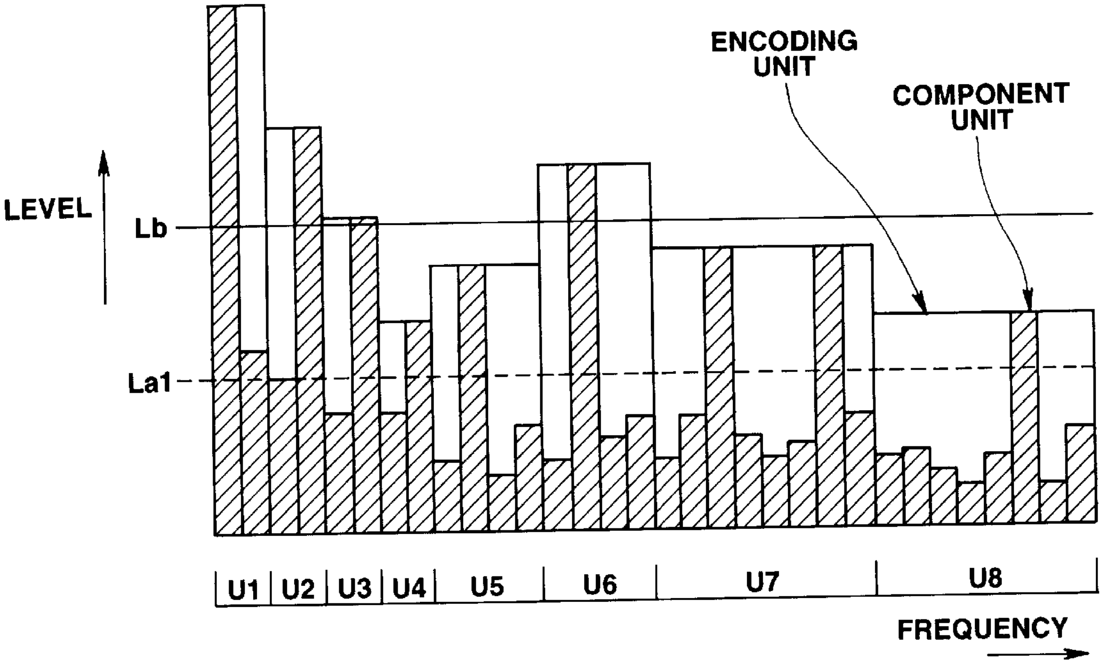
FIG. 12 illustrates the normalization coefficients of encoding units of signals containing noisy components and the normalization coefficients of component units.
Figure 13:
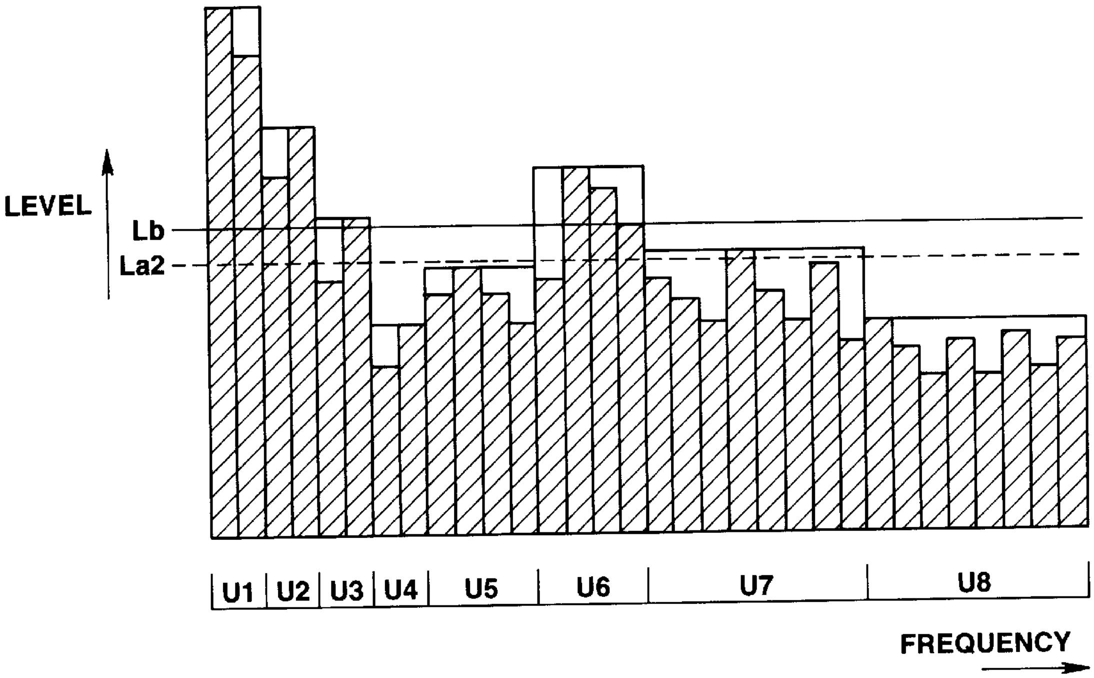
FIG. 13 illustrates the normalization coefficients of encoding units of signals containing tonal components and the normalization coefficients of component units.

FIGS. 12 and 13 illustrate the effect of processing for bit allocation for the first stage described above. In these figures, the blocks shown shaded denote component units. The ordinate denotes the level of the normalization coefficients of the encoding units and the component units. Although the spectral signal components are not normalized in the component units, the numerical figures approximating the maximum absolute value of the spectral signal components of the component units are termed normalization coefficients as in the case of the encoding units.

In the examples of FIGS. 12 and 13, the normalization coefficients ID of the encoding units corresponding to D of the equation (1) are all the same, so that the average values $L_b$ thereof are coincident with one another. Conversely, the average values $L_a$ of the normalization coefficients ID of the component units become $L_{a1}$, and $L_{a2}$ in the case of the example of FIGS. 12 containing tonal signal components and in the case of the example of FIG. 13 containing noisy signal components, respectively, with $L_{a1}$, becoming smaller than $L_{a2}$.

Therefore, if $b_1$ is a constant and $r_{1,i}$ is a constant fixed for each i in the equation (4):

$$B(i) + \frac{D(i) - L_b}{r_{1,i}} + b_1 \tag{4}$$

in accordance with the method known up to now, and the initial value of the quantization coefficients is set for approximating the equation (4), the two values may be set to the same value in the cases of FIGS. 12 and 13.

Conversely, if a quantity fixed for each component unit, as in the bit allocation processing for the first stage as described above, in this case $L_a$, is used, $b_2$ is set to a constant, and $r_{2i}$ is set to a constant fixed for each i, in the equation (5):

$$B(i) + \frac{D(i) - L_a}{r_{2,i}} + b_2 \tag{5}$$

the initial value can be set to different values for the examples of FIGS. 12 and 13.

That is, as may be seen easily from FIGS. 12 and 13, the value of $L_a$ is smaller for the tonal signal components as shown in FIG. 12 than for the noisy signal components as shown in FIG. 13, even if the value of $L_b$ of the two signal components remains the same. If the equation (5) is used at this time, the initial value for quantization precision is set to a higher value for the encoding unit shown in FIG. 12 than for the encoding unit shown in FIG. 13. This is optimally adapted to the fact that, for preventing sound quality deterioration, higher quantization precision needs be given to the tonal components.

If the fact that, if a codelength shorter than that of the quantized value of zero is allocated to the codelength of the quantized values other than zero, as shown in the table of FIG. 7, and higher quantization precision than that given to signal components other than tonal components is given to the tonal components, a smaller number of bits required for encoding suffices, is taken into account, it can be said that the above-described first stage bit allocation leads to setting of a higher initial value of quantization precision. In addition, since the processing is done in the above-described first stage bit allocation in terms of the component unit composed of plural spectral signal components grouped together as a unit, the initial value for the quantization precision can be set with a smaller processing volume than in the case of computing the positions of the tonal signal components on the basis of the spectral components as units for achieving accurate masking calculations.

Although the equation (5) shows an example of employing an index as found from a quantity as found on the component unit basis in setting the initial value of quantization precision (herein $L_a$), the processing method taking into account the band-to-band masking can also be used for calculating B(i) of the equation (5). The initial value for quantization precision can also be set in such a manner as to preclude dropout of signal components of specified bands.

The processing method for adjusting bit allocation for limiting the bits so as to be within the total number of usable bits, by way of the second-stage bit allocation, is now explained.

If, in encoding quantized spectral signal components, variable length codes are used, efficient encoding can be achieved, as discussed above. If the variable length codes are used, the number of required bits cannot be found if only the quantization precision is specified, in distinction from the case of fixed length coding. It is therefore necessary to check how many bits the code for each spectral signal component is made up of in order to find the respective sum values.

The result is that, inconveniently, not only the processing volume for finding the number of bits used in each encoding bit is increased, but also the number of loops required for adjusting the allocation of bits used in each encoding unit in case the quantization precision is changed.

Thus, in the adjustment operation for second-stage bit allocation, shown below, the number of times of bit allocation adjustment operations is decreased by previously adjusting the bit allocation taking into account the overall balance based on an estimated number of bits required in each encoding unit. The estimation of the number of bits required in each encoding unit can be made in accordance with the equation (6):

$$P(i)=W\times J\times H \qquad (6)$$

where W is a simple average value of the variable length codelength corresponding to the quantization precision specified for each encoding unit, J is the number of component units contained in each encoding unit and the H is the number of spectral components in each component unit.

The numbers of bits used in the encoding units can be estimated more effectively by exploiting the normalization coefficients of the component units, as now explained.

Figure 14:
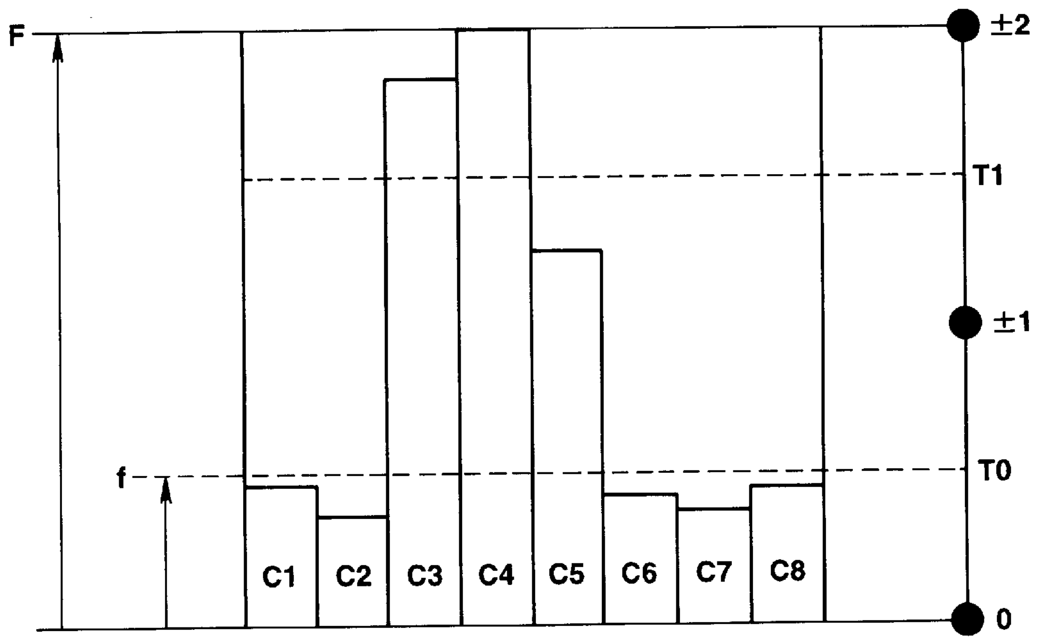
FIG. 14 illustrates processing for bit allocation adjustment employing the component units.

FIG. 14 shows an encoding unit made up of eight component units C1 to C8. Shown on the left-hand and right-hand sides of FIG. 14 are the normalization coefficient of a level F for this encoding unit and the absolute value level in case of quantization from −2 to +2.

In this figure, T0 and T1 denotes boundary values in case the spectral signal components are quantized to respective quantized values. Therefore, the estimated values of the number of bits required for encoding the spectral signal components quantized in the encoding unit may be found in accordance with the equation (7):

$$P(i)=(W_0\times J_0+W_1\times J_1)\times H \qquad (7)$$

where W0 is a code length for the quantized value 0, J0 is the number of component units with the normalization coefficient less than f, W1 is the simple average value of the variable length codelengths for the quantized value other than zero, Ji is the number of the component units with the normalization coefficient not less than f and H is the number of spectral signal components contained in each component unit.

With the equation (7), estimation may be done with higher precision than with the estimated value of the equation (6).

It should be noted that S(i) can be found by the equation (8) from the estimated value P(i) of each encoding unit as found by the above method and the total number of usable bits G in accordance with the equation (8):

$$S(i)=G-\sum_{j=i+1}^{j=N}P(j) \qquad (8)$$

Meanwhile, S(i) is a value, approximated by estimation, of the total number of bits T(i) which has actually been used at a time point of termination of allocation up to the i Æth encoding unit in case bit allocation is done from the low range side encoding unit. This value S(i) is used in processing bit allocation adjustment as later explained. In the following equation (9):

$$T(i)=\sum_{j=i}^{i}Q(j) \qquad (9)$$

Q(i) is the number of bits actually used in the encoding unit in encoding the quantized spectral signal components.

Figure 15:
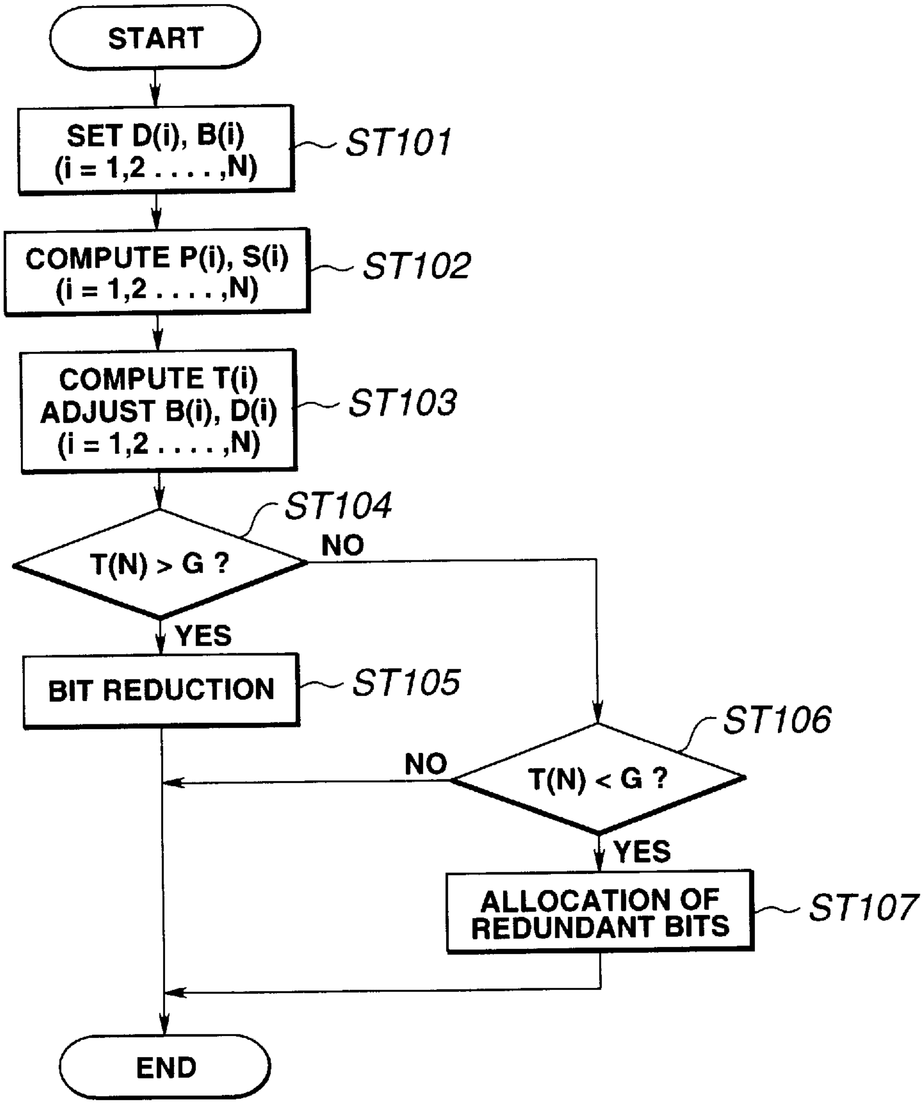
FIG. 15 is a flowchart showing the processing flow of bit allocation adjustment processing employing the component units.

FIG. 15 shows, in a flow chart, an illustrative processing flow of bit allocation at the time of the bit allocation adjustment described above.

Referring to FIG. 15, the normalization coefficients D(i) and the quantization precision information B(i) in each encoding unit are found at step ST101 based on the above-described method. At the next step ST102, an estimated value P(i) of the amount of bits used in each encoding unit is found by the method based on the equation (7), while the above value S(i) is found in accordance with the equation (8). At the next step ST103, bit allocation adjustment is done while the value T(i) is found by processing which will be explained subsequently in detail. At step ST104, it is checked whether or not the total number of bits used T(N) exceeds the total number of usable bits G. If the result is YES, that is if there are redundant bits, processing transfers to step ST105 in order to perform bit reduction processing. This bit reduction processing can be performed by limiting the bandwidth until the total number of usable bits becomes smaller than G. Although the sound quality is degraded by this bit reduction, such sound quality degradation can be practically neglected since the possibility of the result of decision at step ST104 becoming affirmative can be lowered by exploiting the method of the present invention. In addition to band limitation, such a method may be used in which the quantization precision is lowered beginning from the high range side encoding unit so that each encoding unit will have at least three stages (−1, 0, +1) of the quantization steps. If the result of decision at step ST104 is NO, processing transfers to step ST106 in order to check whether or not there are any redundant bits. If there are redundant bits, the redundant bits are additionally allocated at step ST107. This additional allocation may be performed from psychoacoustically crucial low-range side.

Figure 16:
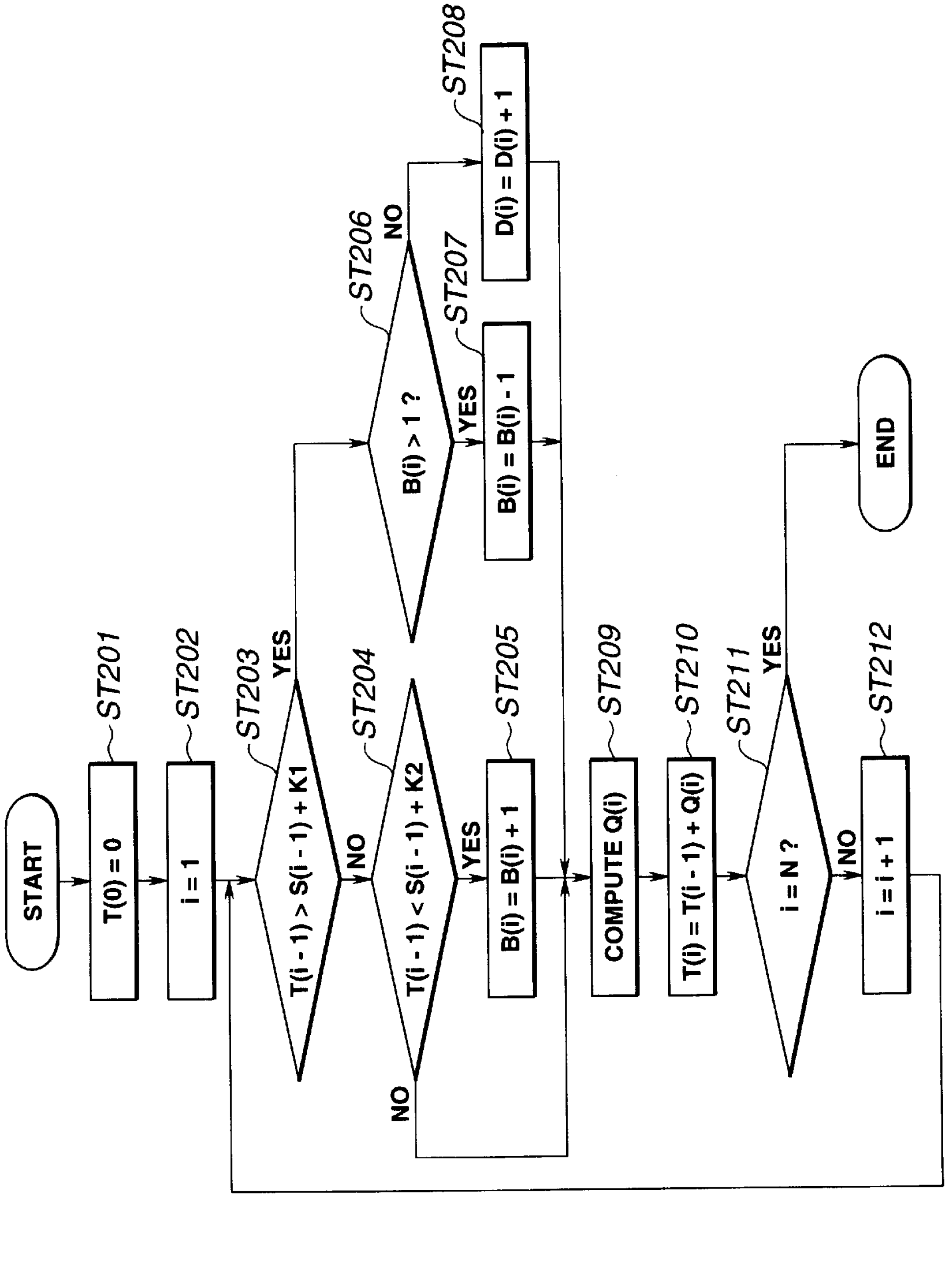
FIG. 16 is a flowchart for illustrating the processing of step ST103 of FIG. 15 in detail.

FIG. 16 shows an illustrative processing showing the processing contents of step ST103 of FIG. 5 in more detail.

First, at steps ST201 and ST202, setting of T(0)=0 and i=1 is made by way of initialization. Processing then transfers to step ST203 where processing proceeds to step ST206 if T(i−1) is larger than S(i−1)+K1. At step ST206, it is checked whether or not the value of B(i) is larger than 1. If the value of B(i) is larger than 1, the quantization step can be lowered without causing dropout of the spectral information. Therefore, processing transfers to step ST207 to lower the quantization step by one before proceeding to step ST209. If T(i−1) is not larger than S(i−1)+K1 at step ST203, processing transfers to step ST204. At this step ST204, it is checked whether or not T(i−1) is smaller than S(i−1)+K2, where K2 is a negative integer. If the result of check is YES, processing transfers to step ST205 in order to raise the quantization step by one before proceeding to step ST209. If otherwise, processing transfers directly to step ST209. At step ST209, the number of bits Q(i) required actually in the encoding unit is calculated. At the next step ST210, T(i) is found from T(i−1) and Q(i). At step ST211, it is checked whether or not the encoding unit currently processed is the last encoding unit. If the result is YES, processing is terminated. If the encoding unit is not the last encoding unit, the value of i is incremented by one at step ST212 before reverting to step ST203.

In the above description, K1 and K2 are assumed to be of the same value for all values of i. However, K1 and K2 may also be varied depending on the value of i. For example, if, towards the end of the bit allocation adjustment operations, the number of actually required bits C(i) becomes significantly larger than the estimated number of bits P(i) for the encoding unit, the probability of the bit shortage occurring ultimately becomes higher. Thus, for the encoding units towards the end, the value of K1 may be of a negative value. By so doing, the probability of the result of decision at step ST204 being affirmative may be lowered.

In the foregoing description, bit adjustment processing is performed beginning from the low range side for simplifying the processing. However, the bit adjustment processing may also be performed in the order of the decreasing values of the normalization coefficients. By so doing, if bit shortage occurs towards the end if the bit adjustment, the effect of sound quality degradation caused by the lowering of the quantization precision information on the hearing sense may be minimized.

Also, in the foregoing description, the method for reducing the number of bits is divided in two depending on the value of B(i). It is however possible to use larger values of the normalization coefficients in either cases without regard to the value of B(i). The method for reducing the number of bits may include a method of enlarging the scope of quantization to codes of shorter codelengths in addition to the method of enlarging the normalization coefficients.

Figure 17:
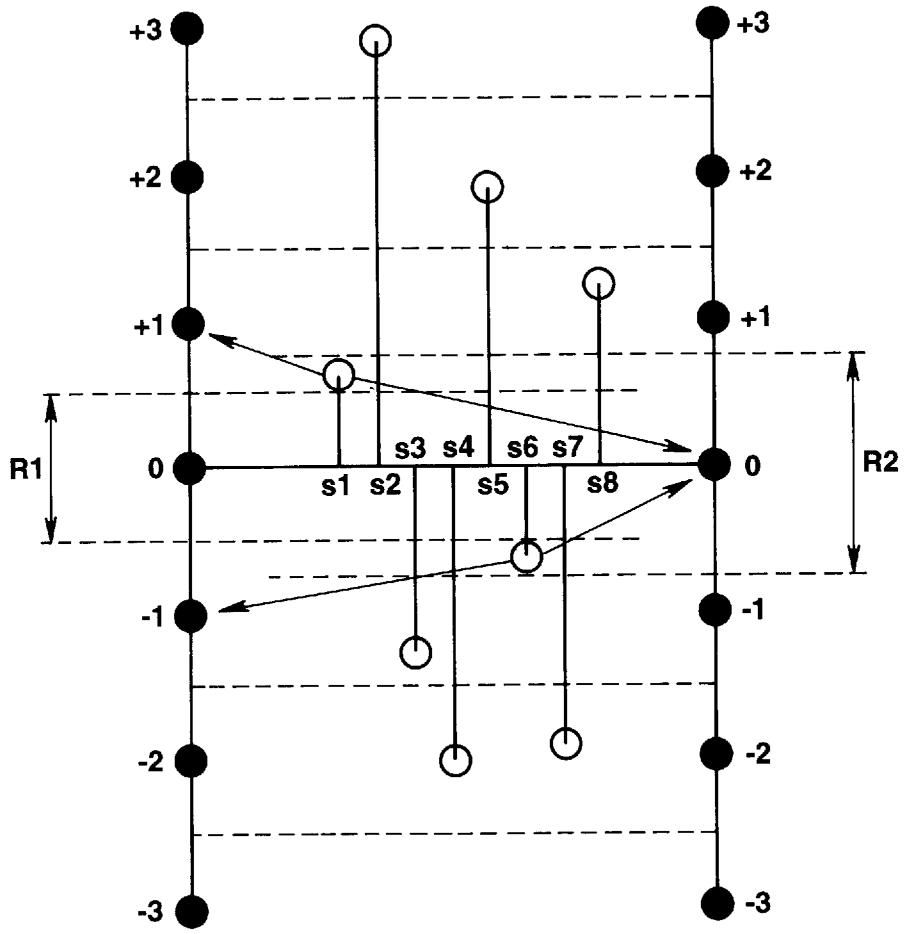
FIG. 17 illustrates quantization for reducing the number of bits by varying the range of quantization to 0 with short codelength.

FIG. 17 shows, as an example of the method for reducing the number of bits by enlarging the scope of quantization to a shorter codelength, the effect derived from enlarging the scope of quantization to 0 as a code of shorter codelength from R1 to R2. That is, in FIG. 17, the ranges R1, R2 of values quantized to 0, to which the shorter codelength is afforded in the present embodiment, differ between the quantization method shown towards left and that shown towards right. With the quantization method shown towards right of FIG. 17, employing R2 as the range of the value quantized to 0, the quantization noise becomes larger than with the quantization method shown towards left.17, employing R1. However, with the quantization method shown towards right in FIG. 17, the ratio of the spectral signal components, for which the quantized value with a shorter codelength becomes zero, becomes higher, so that encoding can be done with a smaller number of bits. With the present method, the psychoacoustically crucial spectral signal components of larger amplitudes are decoded to the same spectral signal components which are the same as those minimizing the quantization noise, sound quality degradation can be prevented effectively. If, with the present method, there are a sufficient number of usable bits, it is desirable to minimize the quantization noise in each encoding unit. Therefore, sound quality degradation can be minimized by performing the above processing after first allocating the bits.

As will become clear from the foregoing description, the increase or decrease of bit allocation is adjusted based on the estimated value, so that adjustment to nearly optimum quantization precision may be achieved under the given total number of bits even with a single loop. In particular, if the estimated value is calculated using the normalization coefficients of the component unit, an estimated value of high precision can be obtained, so that adjustment closer to optimum adjustment can be achieved.

The method for extracting and separating tonal signal components bases on the use of the component unit as unit is now explained.

Figure 18:
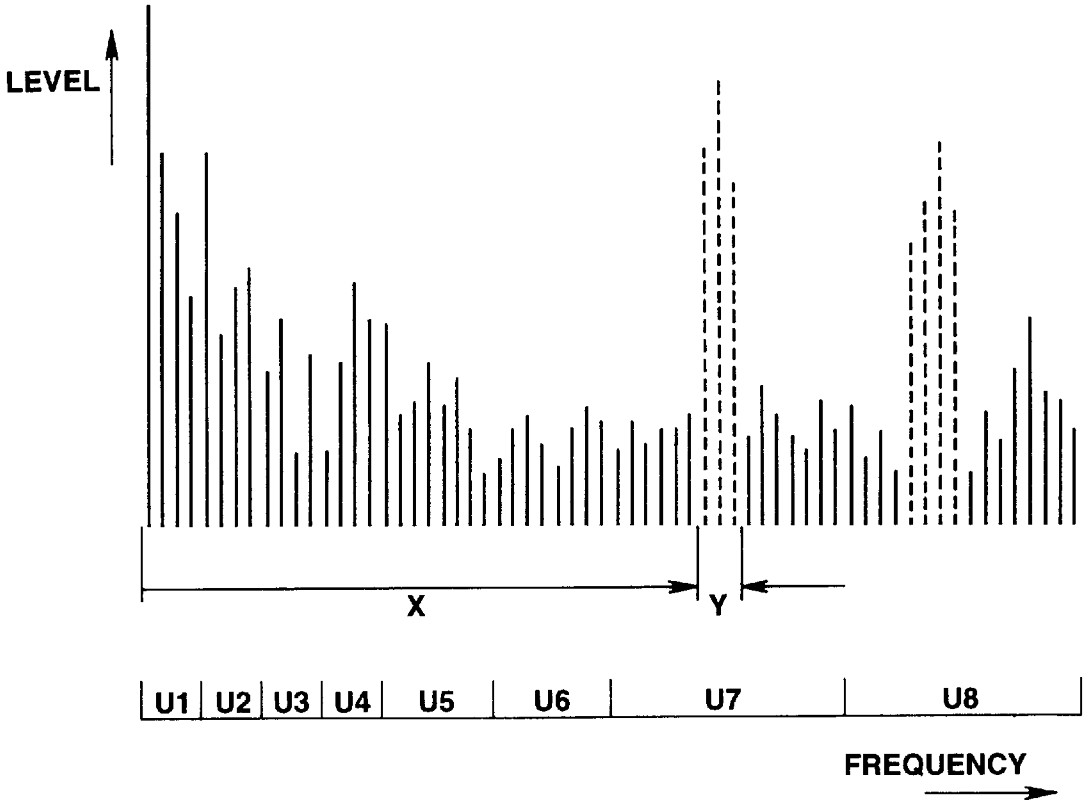
FIG. 18 illustrates extraction and separation of tonal signal components.

FIG. 18 illustrates extraction and separation of tonal signal components. The tonal signal components, shown by broken lines in FIG. 18, need to be quantized with high precision for maintaining the sound quality. However, if the totality of the spectral signal components in the encoding unit containing the tonal signal components are encoded with high precision with longer bit lengths, the encoding efficiency is lowered. It is therefore preferred to separate these tonal components for encoding. The method of separating these tonal signal components for encoding is proposed in the aforementioned U.S. application Ser. No. 08/374,518.

Figure 19:
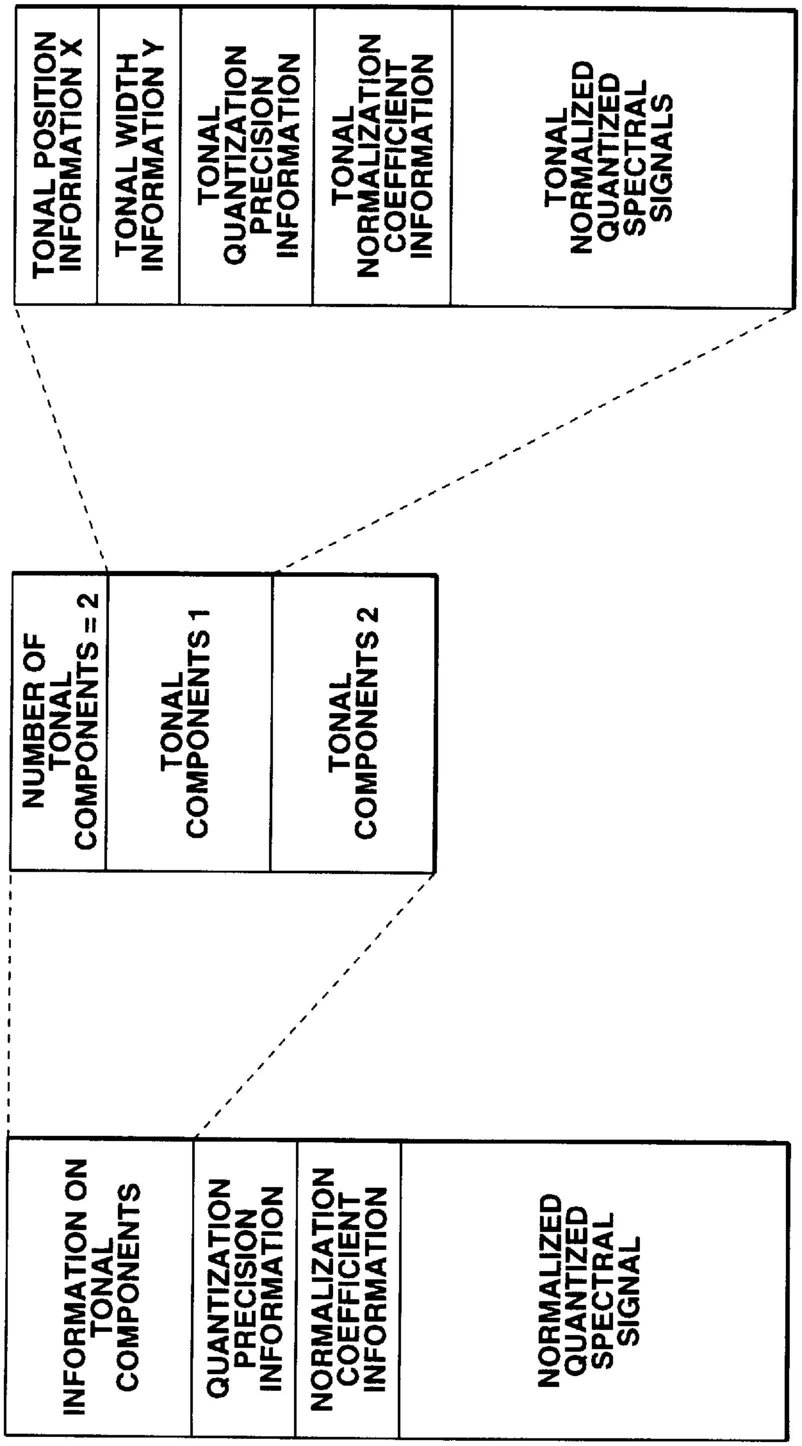
FIG. 19 illustrates a typical method for recording the codes obtained in accordance with the present invention.

FIG. 19 shows an example of recording the separated tonal signal components on the recording medium. In the example of FIG. 19, the tonal component information as the information concerning the tonal signal components is recorded in addition to the quantization precision information and normalization coefficients information for reproducing the spectral signal components encoded from one encoding unit to another, and the normalized and quantized spectral signal components. The tonal component information of the present example includes two tonal signal components, each having the quantization precision information and the normalization coefficient information for the tonal signal component (termed the tonal quantization precision information and the tonal normalization coefficient information, respectively) and the normalized and quantized tonal spectral signal components (termed normalized and quantized spectral signals). In addition, the tonal component includes information includes the position information of the tonal signal components denoting X in FIG. 18 (tonal position information) and the information on the width of the tonal signal component denoting Y in FIG. 18, that is the information on the number of the tonal signal components (tonal width information). These, however, are merely illustrative and, as the manner of encoding the tonal signal components, the encoding manner with higher efficiency, such as is shown in the above-mentioned U.S. application Ser. No. 08/374,518, has been proposed. However, since the information such as the tonal position information specifying the position of the tonal signal components is also required for encoding the tonal signal components, it is also possible to separate the tonal signal components only on the high frequency side having broader bandwidths of the encoding units.

In separating the tonal signal components, it is stated in the aforementioned U.S. application Ser. No. 08/374,518 to check whether or not each spectral signal component represents the locally maximum component and whether or not the signal energy is locally concentrated in the spectral signal component combined with the neighboring spectra signal components. This method includes judgment processing for respective spectral signal components, so that the processing volume is occasionally increased to some extent.

For enabling tonal signal components to be extracted by simpler processing by the present embodiment, the component units, as candidates for extraction of tonal signal components, are first extracted, and part or all of the extracted component units are selected as being component units made up of the tonal components. Alternatively, the tonal signal components are extracted from the respective spectral signal components contained in the component units for extracting and separating the tonal signal components by a smaller processing volume.

Figure 20:
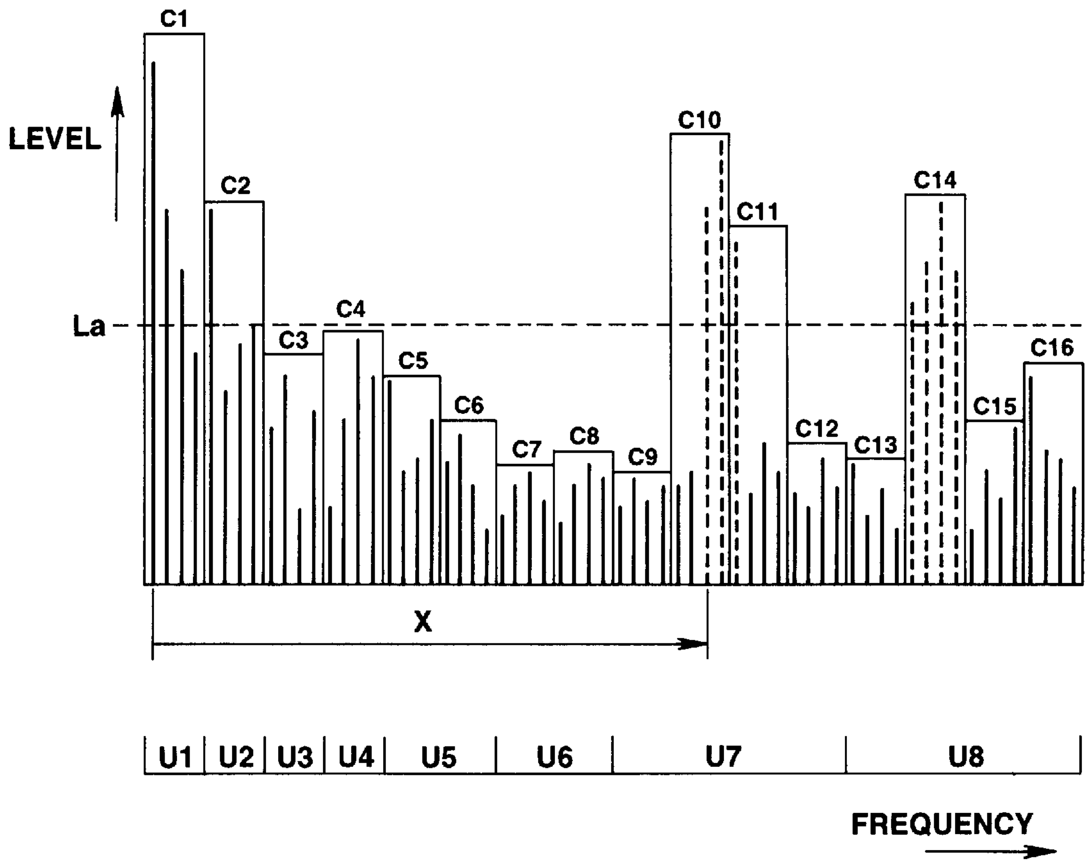
FIG. 20 illustrates simplified extraction and separation of the tonal signal components.

FIG. 20 illustrates the method for extracting the tonal signal components described above. In the present embodiment, the tonal signal components are extracted and separated only from the high frequency side. In this figure, La is an average value of the normalization coefficients ID of the component units. The component units located on the higher side than the encoding unit U4 and the normalization coefficients ID of which are larger than $L_a$ described above, that is component units C10, C11 and C14, are used as candidates for the component units containing tonal signal components.

For simplifying the processing, all of the spectral signal components contained in these candidate component units may be separated and encoded as tonal signal components. However, if two neighboring component units have been selected as candidates, the probability is high that a group of the tonal signal components astride these two component units have been selected as being the tonal signal components contained in both of these two component units. In such case, a large number of bits are allocated to signal components other than the tonal signal components contained in these component units. The illustrative processing shown for example in FIG. 21 may be used for processing the tonal signal components lying astride these two component units in a unified manner for raising the encoding efficiency.

Figure 21:
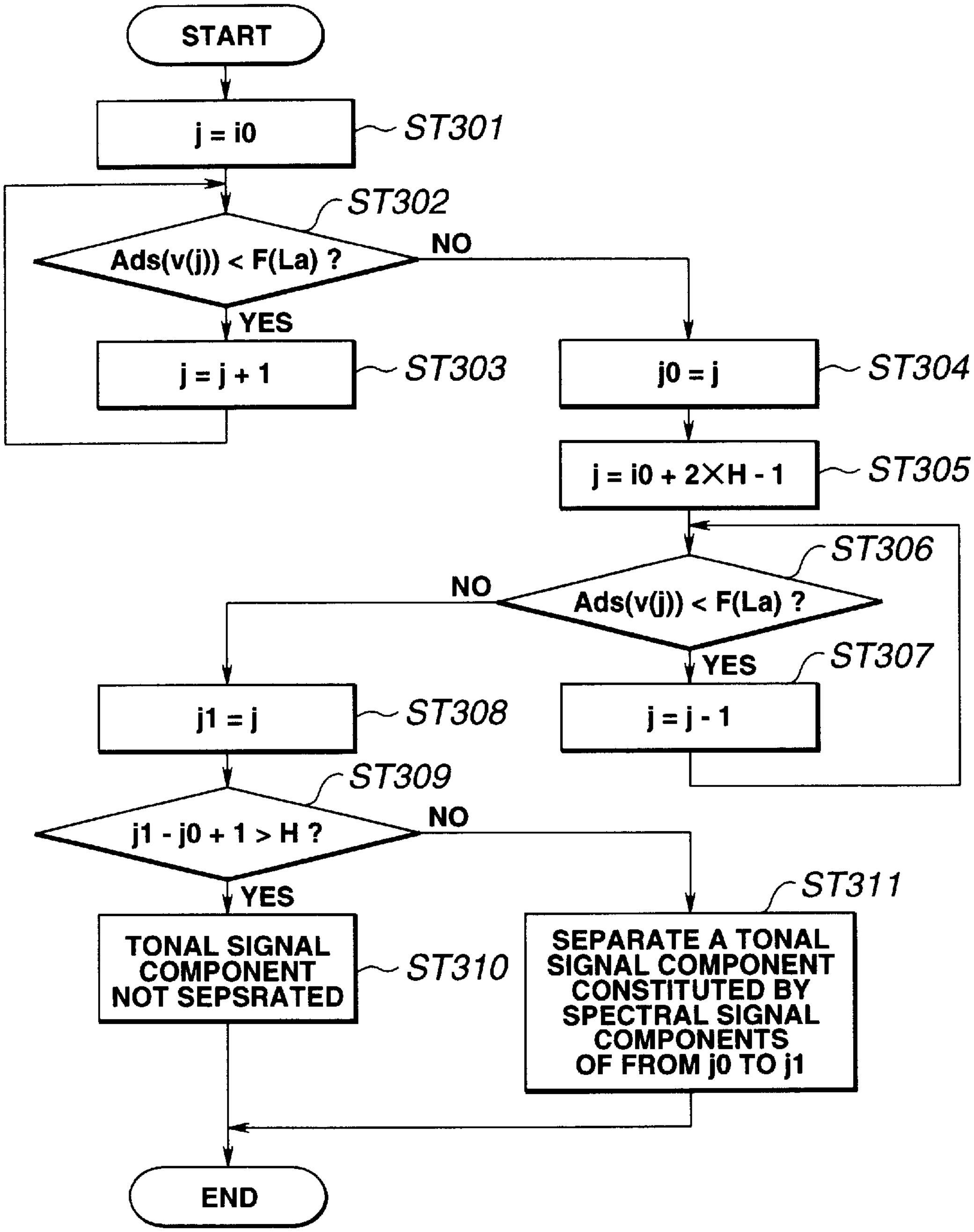
FIG. 21 is a flowchart showing the processing flow of simplified extraction and separation of the tonal signal components.

In the illustrative processing, shown in FIG. 21, the number of the lowermost side spectral component iO contained in the two component units is set as j at step ST301. Then, at step ST302, it is checked whether or not the absolute value of the amplitude of the spectral component having the number j is smaller than the absolute amplitude value $F(l_a)$ corresponding to $L_a$. If the result is YES, processing transfers to step ST303 where the value of j is incremented by one before processing reverts to step ST302. If the result of check at step ST302 is NO, processing transfers to step ST304 where iO is set as j. Then, processing transfers to step ST305 where the number of the spectral component of the highest frequency contained in the two component units iO+2 H−1, where H is the number of the spectral signal components contained in the component units, is set as j. Then, at step ST306, it is checked whether or not the absolute value of the amplitude of the spectral component having the number j is smaller than absolute amplitude value $F(l_a)$ corresponding to $L_a$. If the result f check at step ST306 is YES, processing transfers to step ST307 where the value of j is decremented by one before processing reverts to step ST306. If the result of check at step ST306 is NO, processing transfers to step ST308 where ji is set as j. It is then checked at step ST309 whether or not the bandwidth from j0 to j1 is wider than H. If the result of check at step ST309 is YES, processing transfers to step ST310 where it is determined that the tonal signal components are not separated at this step. If the result of check at step ST309 is NO, processing transfers to step ST311 where a tonal signal component with the bandwidth from jO to j1 is separated. It is noted that, while it is determined that, if the bandwidth is larger than H, tonal components are not separated, the reference bandwidth may be set to a value other than H. If the result of check at step ST309 is YES, the two component units can be extracted and separated as being tonal signal components. It is also possible to separate H spectral signal components of from jO to jO+H−1 as being tonal signal components.

In the embodiment of FIG. 20, the width of the tonal signal components lying astride two component units is narrower than the width of the component unit, these tonal signal components being extracted in the course of the processing of FIG. 21. If a lone component unit has been extracted as a candidate of a component unit containing a tonal signal component, processing similar to that of FIG. 21 is performed on this lone component unit for enabling the tonal signal components of narrower widths to be extracted and separated from this component unit.

In the aforementioned U.S. application Ser. No. 08/553,449, there is disclosed a method for grouping the tonal signal components in accordance with the width of the tonal signal component (number of constituent spectral signal components) for raising the encoding efficiency. If this method is used, the number of the constituent spectral signal components of the tonal signal components in their entirety may be matched to the number of the constituent spectral signal components of the component unit for raising the efficiency and simplifying the operation. The case of matching the number of the constituent spectral signal components of the tonal signal components in their entirety to the number of the constituent spectral signal components of the component unit, inclusive of the case of extracting a group of the tonal signal components from two component units, is naturally comprised within the method of the present invention.

If there exist three or more consecutive component units exceeding $L_a$, the probability is high that the distribution of the spectral signal components be planar. In such case, it is possible to perform extraction of the tonal signal components on the proviso that these component unit be not separated as the tonal signal components.

It is seen from above that the above-described method for extracting and separating the tonal signal components leads to extraction of the tonal signal components by a simpler operation.

The above-described signal encoding methods according to the present invention have many features in common, for example, using normalization coefficients found from one component unit t another. In such case, processing can be carried out efficiently by combining two or more of the processing encoding methods.

The foregoing description has been made of an illustrative structure employing signals filtered by a band-splitting filter and orthogonally transformed by MDCT, or signals inverse orthogonally transformed by inverse MDCT (IMDCT) as band-synthesizing means and subsequently filtered by a band-synthesis filter. Of course, the signals may be directly processed with MDCT or IMDCT without employing a band-splitting filter or a band-synthesis filter. The orthogonal transform may also be DFT or DCT in place of MDCT.

Although the foregoing description has been made of the case of using an acoustic waveform signals, the method of the present invention may also be applied to other sorts of signals, such as, for example, video signals. However, if the audio signals are orthogonally transformed, such as MDCTed, to provide a signal converted into a large number of spectral signal components, for processing by the method of the present invention, the method of the present invention may be applied most efficiently since crucial signals are then concentrated in specified frequencies and the extraction, separation and encoding of the variable length codes or the tonal signal components raises the encoding efficiency.

What is claimed is:

1. A signal encoding method for quantizing and encoding signal components resulting from resolution of an input signal into plural frequency components, comprising:

splitting the signal components of the input signal into plural band units as encoding units;

computing an estimated value of the required number of bits as calculated from one band unit to another; and adjusting the total number of bits required in encoding the signal components of the input signal based on the estimated value of the required number of bits as computed from one band unit to another.

2. The signal encoding method as claimed in claim 1 wherein the signal components of the input signal are split into plural second band units narrower than said band units; and the estimated value of the required number of bits to be computed from one band unit to another is computed in accordance with an index as calculated from one second band unit to another.

3. The signal encoding method as claimed in claim 2 wherein the index computed from one second band unit to another is a value approximate to the maximum absolute value of the signal components in said second band unit.

4. The signal encoding method as claimed in claim 1 wherein the total number of bits is adjusted based on the difference between a target value found from the estimated value of the required number of bits as found from one band unit to another and the number of bits actually allocated to each band unit, and wherein the manner of adjustment based on said difference is varied responsive to the number of band units for which adjustment has not come to a close.

5. The signal encoding method as claimed in claim 1 wherein the order in which the band units are adjusted is determined based on the signal component levels of the band units.

6. The signal encoding method as claimed in claim 1 wherein the band units become broader with increasing frequency.

7. The signal encoding method as claimed in claim 1 wherein variable length coding is used for encoding.

8. The signal encoding method as claimed in claim 1 wherein the input signal is an acoustic signal.

9. The signal encoding method as claimed in claim 1 wherein the signal components are spectral signal components obtained on transforming the time-domain input signal into a frequency-domain signal.

* * * * *

UNITED STATES PATENT AND TRADEMARK OFFICE

CERTIFICATE OF CORRECTION

PATENT NO. : 5,825,310
DATED : October 20, 1998
INVENTOR(S) : KYOYA TSUTSUI

It is certified that error appears in the above-identified patent and that said Letters Patent is hereby corrected as shown below:

IN THE ABSTRACT:

At line 4 of the Abstract, please replace "At step ST102" with --"First"--.

At line 7 of the Abstract, after "the input signal is", please insert --then--.

At lines 7 - 8 of the Abstract, please delete "in steps ST103 and in the following steps".

IN THE CLAIMS:

At column 17, line 34, after "value", please insert --, for a plurality of the encoding units,--

At column 17, line 34, please delete --required--.

At column 17, line 35, please delete --as calculated from one band unit to another; and--

At column 17, line 35, after "bits", please insert --required to encode each encoding unit;

computing an estimated value of the total number of required bits based on summing the estimated values for each encoding unit; and--

At column 17, line 38, after "value of the", please delete --required-- and insert --total--

At column 17, line 38, after "number of", please insert --required--

UNITED STATES PATENT AND TRADEMARK OFFICE

CERTIFICATE OF CORRECTION

PATENT NO. : 5,825,310

DATED : October 20, 1998

INVENTOR(S) : KYOYA TSUTSUI

It is certified that error appears in the above-identified patent and that said Letters Patent is hereby corrected as shown below:

At column 17, lines 38-39, please delete --as computed from one band unit to another.--

At column 18, line 5, after "value of the", please insert --total--

At column 18, line 5, please delete --required--

At column 18, line 5, after "number of" please insert --required--

At column 18, line 5, after "bits", please delete --to be computed from one band unit to another--

At column 18, line 7, after "as calculated", please insert --for a plurality of the--

At column 18, line 7, delete --from one--

At column 18, line 8, please insert after the word "unit" an --s--

At column 18, line 8, please delete --to another.--.

At column 18, at line 10, please delete --from one--

At column 18, line 10, after "computed" please insert --for a plurality of the--

At column 18, line 10, please insert after the word "unit" an --s--

At column 18, line 10 - 11, please delete --to another--

At column 18, line 16, after "value of the" please insert --total--

UNITED STATES PATENT AND TRADEMARK OFFICE
CERTIFICATE OF CORRECTION

PATENT NO. : 5,825,310
DATED : October 20, 1998
INVENTOR(S) : KYOYA TSUTSUI

It is certified that error appears in the above-identified patent and that said Letters Patent is hereby corrected as shown below:

At column 18, line 16, delete --required--

At column 18, line 16, please insert after "number of" --required--

At column 18, line 16, after "bits" please delete --as found from one band unit to another--

Signed and Sealed this

Twenty-third Day of March, 1999

Attest:

Q. TODD DICKINSON

*Attesting Officer* *Acting Commissioner of Patents and Trademarks*